United States Patent
Fullam et al.

(10) Patent No.: US 10,136,512 B2
(45) Date of Patent: Nov. 20, 2018

(54) AVOIDING REFLECTIONS IN PCB SIGNAL TRACE

(71) Applicant: Microsoft Technology Licensing, LLC, Redmond, WA (US)

(72) Inventors: Scott Francis Fullam, Palo Alto, CA (US); Patrick Timothy Codd, Belmont, CA (US); Agustya Ruchir Mehta, Mountain View, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 14/565,360

(22) Filed: Dec. 9, 2014

(65) Prior Publication Data
US 2016/0165728 A1    Jun. 9, 2016

(51) Int. Cl.
*H05K 7/00* (2006.01)
*H05K 1/02* (2006.01)

(52) U.S. Cl.
CPC ......... *H05K 1/0253* (2013.01); *H05K 1/0224* (2013.01); *H05K 1/0243* (2013.01); *H05K 2201/0391* (2013.01); *H05K 2201/09272* (2013.01); *H05K 2201/09681* (2013.01); *H05K 2201/09727* (2013.01); *H05K 2201/09736* (2013.01)

(58) Field of Classification Search
CPC .. H05K 1/0224; H05K 1/0243; H05K 1/0253; H05K 1/0296; H05K 1/18; H05K 2201/0391; H05K 2201/09272; H05K 2201/09681; H05K 2201/09727; H05K 2201/09736
See application file for complete search history.

(56) References Cited

U.S. PATENT DOCUMENTS

| | | | |
|---|---|---|---|
| 6,225,568 B1 * | 5/2001 | Lin | H05K 1/0224 174/117 FF |
| 7,756,556 B2 | 7/2010 | Patel et al. | |
| 7,766,680 B2 | 8/2010 | Suzuki et al. | |

(Continued)

FOREIGN PATENT DOCUMENTS

| | | |
|---|---|---|
| CN | 1383353 A | 12/2002 |
| JP | 2000077802 A | 3/2000 |

(Continued)

OTHER PUBLICATIONS

"Optimizing Impedance Discontinuity Caused by Surface Mount Pads for High-Speed Channel Designs", In Altera Corporation, Serial No. AN-530-1.0, May 2008, 8 pages.

(Continued)

*Primary Examiner* — Yuriy Semenenko
(74) *Attorney, Agent, or Firm* — Alleman Hall Creasman & Tuttle LLP

(57) ABSTRACT

Embodiments are disclosed for a printed circuit board. An example printed circuit board includes a ground plane comprising a pattern of an electrically conductive material. The example printed circuit board further includes a circuit trace disposed adjacent to the ground plane, where one or more characteristics of one of more of the pattern of the electrically conductive material in the ground plane and the circuit trace vary based upon a directional change of the circuit trace.

13 Claims, 9 Drawing Sheets

(56) References Cited

U.S. PATENT DOCUMENTS

| | | | |
|---|---|---|---|
| 8,058,954 | B2 | 11/2011 | Yeates |
| 8,188,925 | B2 | 5/2012 | DeJean |
| 8,248,183 | B2 | 8/2012 | Syal |
| 2001/0010270 | A1 | 8/2001 | Lin et al. |
| 2002/0126951 | A1 | 9/2002 | Sutherland et al. |
| 2002/0153611 | A1* | 10/2002 | Nakanishi ............ H05K 1/0224 257/758 |
| 2003/0193772 | A1* | 10/2003 | Thomason ............ G06F 1/1616 361/679.27 |
| 2007/0063782 | A1* | 3/2007 | Kanno .................... H01P 3/081 333/4 |
| 2008/0230259 | A1 | 9/2008 | Booth, Jr. et al. |
| 2010/0231331 | A1* | 9/2010 | Toyoshima .......... H05K 1/0224 333/238 |
| 2012/0206301 | A1 | 8/2012 | Flores-Cuadras et al. |
| 2013/0104394 | A1 | 5/2013 | Hardin et al. |

FOREIGN PATENT DOCUMENTS

| | | | |
|---|---|---|---|
| JP | 2000114722 | A | 4/2000 |
| JP | 2001085805 | A | 3/2001 |
| JP | 2006147837 | A | 6/2006 |
| JP | 2006173310 | * | 6/2006 |
| JP | 2006173310 | A | 6/2006 |
| JP | 2007123740 | A | 5/2007 |
| WO | 2005112526 | A1 | 11/2005 |
| WO | 2014089587 | A1 | 6/2014 |

OTHER PUBLICATIONS

"Flexible Designs", In Proceedings of the PCB Design Magazine, Jun. 2013, 61 pages.

"Solid ground-plane vs Hatched ground-plane", Published on: Nov. 8, 2010 Available at: http://electronics.stackexchange.com/questions/5139/solid-ground-plane-vs-hatched-ground-plane.

"Cirtech Technical Manual Version 9.2", Retrieved on: Sep. 9, 2014 Available at: http://www.cirtech-electronics.com/files/Technical-Manual-9.2.pdf.

ISA European Patent Office, International Search Report and Written Opinion Issued in Application No. PCT/US2015/062874, dated Feb. 16, 2016, WIPO, 13 pages.

IPEA European Patent Office, International Preliminary Report on Patentability Issued in PCT Application No. PCT/US2015/062874, dated Feb. 20, 2017, WIPO, 8 Pages.

IPEA European Patent Office, Second Written Opinion Issued in PCT Application No. PCT/US2015/062874, dated Oct. 25, 2016, WIPO, 7 Pages.

"Search Report Issued in European Patent Application No. 18151682.4", dated May 8, 2018, 7 Pages.

"Office Action Issued in Chinese Patent Application No. 201580067130.X", dated Sep. 5, 2018, 14 Pages.

* cited by examiner

AVOIDING REFLECTIONS IN PCB SIGNAL TRACE

BACKGROUND

An electronic device may utilize a printed circuit board (PCB) to electrically couple components of a circuit using signal traces. A PCB includes a ground planes separated from signal traces via a dielectric layer, wherein the ground plane(s) may comprise either a solid sheet of conductive material or a pattern of conductive material.

SUMMARY

Examples are disclosed that relate to helping to avoid reflections in a conductive trace of a printed circuit board. In one example, a printed circuit board comprises a ground plane comprising a pattern of an electrically conductive material, and a circuit trace disposed adjacent to the ground plane, wherein one or more characteristics of one or more of the pattern of the electrically conductive material in the ground plane and the circuit trace vary based upon a directional change of the circuit trace.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

A solid ground plane (e.g., a ground plane with 100% fill of conductive material) or a solid signal reference plane (e.g., a plane that is not connected directly to ground) for a PCB may provide a substantially uniform geometric relationship between the ground plane and a circuit trace disposed over the ground plane, thereby helping to ensure that an impedance of the trace does not vary significantly along the path of the trace at signal frequencies. However, a solid ground plane may be more rigid, heavier, and more costly than a ground plane having a pattern of conductive material (e.g., a ground plane with less than 100% fill of conductive material). Accordingly, some printed circuit boards, such as flexible printed circuit boards, may utilize a patterned ground plane.

Patterned ground planes having a regularly-repeating pattern of conductive material, such as a grid of conductive material, may maintain the above-described impedance consistency for straight portions of a circuit trace where the trace maintains a regular geometric relationship with the pattern (e.g. the trace is aligned with one set of ground plane lines of a rectangular ground plane pattern). However, circuit traces may change direction in the plane of the printed circuit board along a conductive path. As the geometry between the circuit trace and ground plane changes, the impedance of the trace may vary sufficiently to give rise to undesired reflections of signals traveling the trace.

Figure 1:
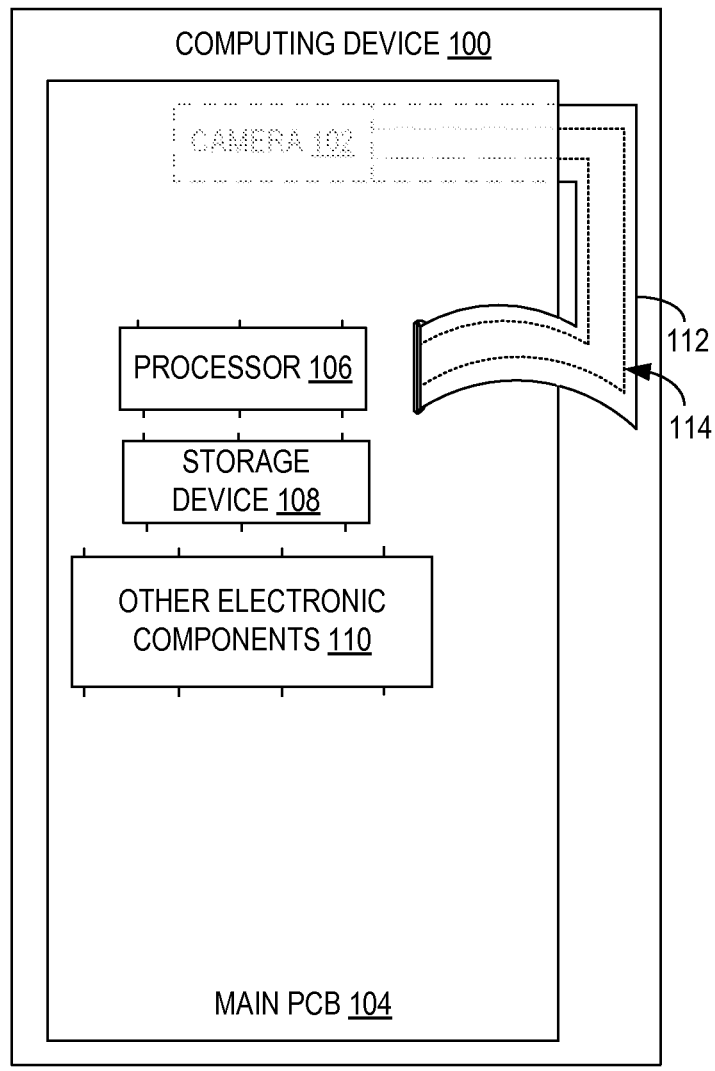
FIG. 1 shows an example computing device comprising a flexible printed circuit board.

Thus, the present disclosure discloses examples of varying a pattern of conductive material in a ground plane to help maintain an impedance value along the length of a circuit trace within a desired range. This may help to avoid reflections and other problems with circuit components. It is to be understood that the term "ground plane" as used herein may refer to a ground plane that is directly connected to ground and/or a signal reference plane that is not directly connected to ground. FIG. 1 shows an example computing device 100 including a camera 102, which may correspond to a front- or rear-facing camera on a smartphone. Computing device 100 also includes a main printed circuit board (PCB) 104, which is depicted as including a processor 106, a storage device 108, and one or more other electronic components 110, such display subsystems, networking interfaces or other communication subsystems, input device and/or sensor interfaces, etc. In other embodiments, any other suitable component or group of components may be located on a PCB. Further, while illustrated as a mobile device including a camera 102, it will be understood that computing device 100 may take the form of any suitable computing device, including but not limited to a smartphone, a tablet, a wearable device, a personal computer, a laptop computer, a digital camera, and/or any other electronic device comprising a printed circuit board.

As camera 102 is disposed on an opposite side of the main PCB 104 than the processor 106, a flexible PCB comprising a camera interface 112 is included in computing device 100 to carry signals from camera 102 to main PCB 104. In the example of FIG. 1, camera interface 112 may connect to camera 102 adjacent to a back surface of main PCB 104 at one end and connect to a front surface of main PCB 104 at another end. The use of a flexible PCB may allow the camera to be conveniently coupled to the main circuit board. However, as mentioned above, a flexible PCB may utilize a patterned ground plane. Thus, directional changes of PCB traces in the plane of the printed circuit board may potentially give rise to reflections arising from changes in impedance caused by changes in the geometry of the trace relative to the ground plane in such regions.

In order to address such issues, one or more characteristics of a pattern of the ground plane may be varied in regions where the circuit traces 114 change direction in order to maintain a suitably consistent impedance along the length of the trace. As described in more detail below, such pattern variations may include, but are not limited to, variations in a shape or layout of the pattern, variations in materials used to form the pattern and/or trace, and/or variations in a thickness of the pattern.

Figure 2:
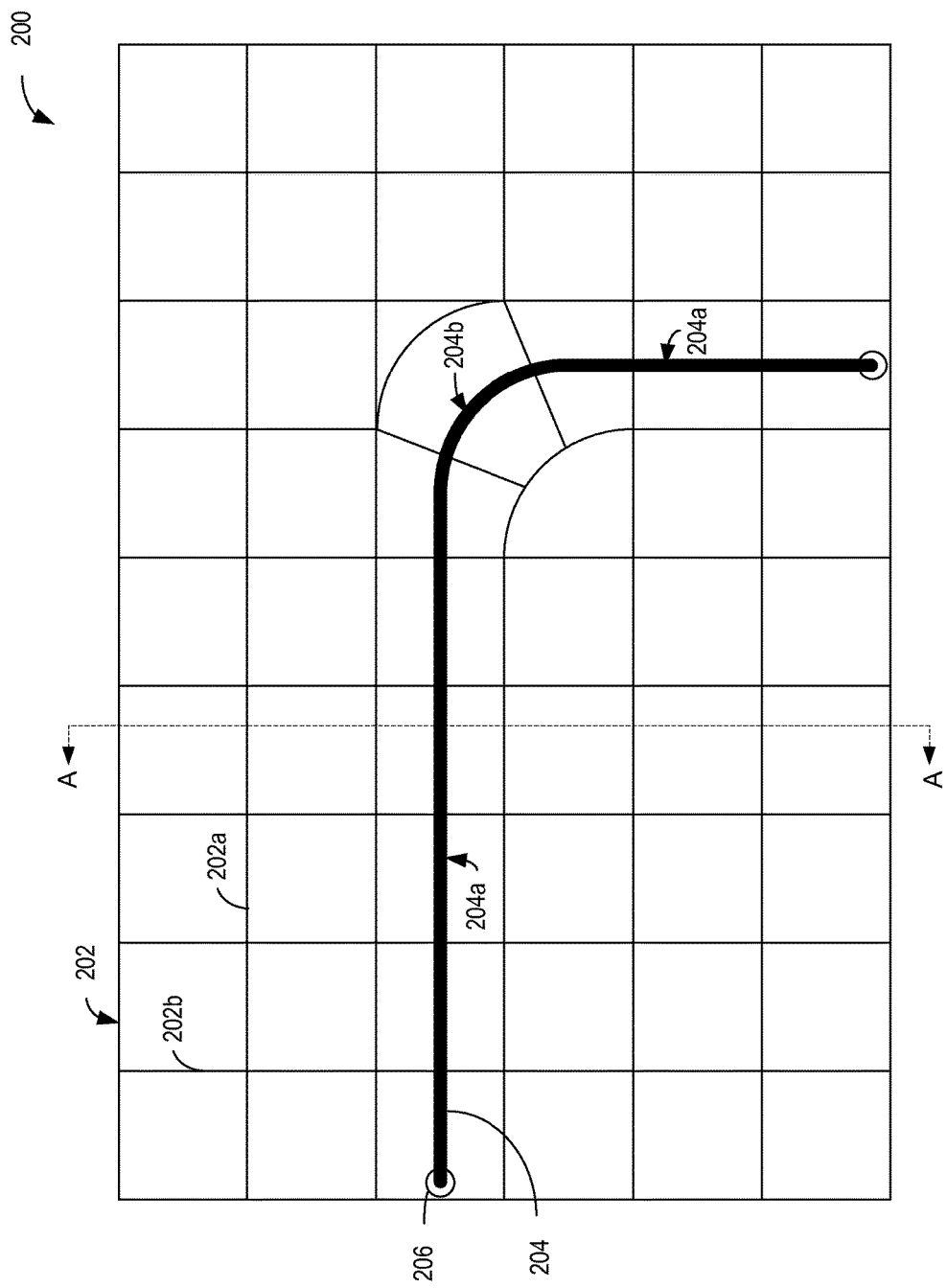
FIG. 2 shows an example printed circuit board comprising a ground plane with a rectangular grid pattern of conductive material, and illustrates a variation of the pattern based upon a directional change of a circuit trace.
Figure 3:
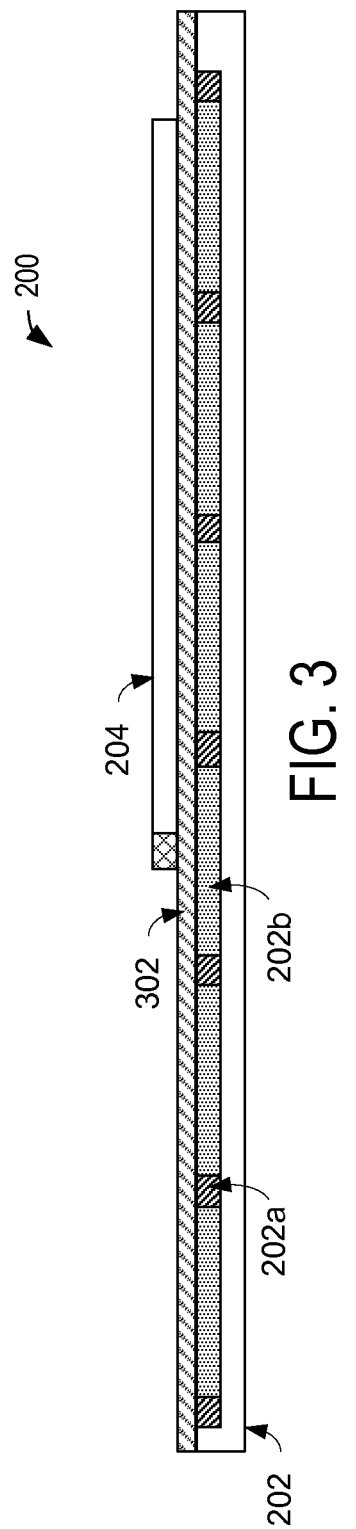
FIG. 3 shows a cross section of the printed circuit board of FIG. 2.

FIGS. 2 and 3 show one example approach for varying a pattern of a ground plane in a region of a directional change of a circuit trace of a PCB 200. PCB 200 includes a ground plane 202 comprising a rectangular grid of conductive material. The grid includes lines of conductive material having a first direction 202a and lines of conductive material having a second direction 202b, wherein the first and second directions are depicted as being perpendicular to one another). PCB 200 also includes a circuit trace 204 disposed adjacent to ground plane 202 and separated from ground plane 202 via a dielectric layer, as seen in the sectional view of FIG. 3. Further, PCB 200 also may comprise one or more openings, such as opening 206, to allow circuit trace 204 to electrically connect to other layers.

The depicted circuit trace 204 includes portions 204a that are uncurved in a plane of the ground plane, and a portion 204b that is curved in the plane of the ground plane. The uncurved portions 204a of the circuit trace 204 intersect perpendicular lines of the ground plane pattern at a substantially 90 degree angle (e.g., forming a perpendicular arrangement), and maintain a generally consistent spacing from parallel lines of the ground plane. Such an arrangement may help to maintain an impedance of the trace within a suitable range to avoid unwanted signal reflections.

However, depending upon a path taken by the curved portion 204b of the circuit trace, the geometry of the ground plane pattern relative to the trace may change along the length of the curved portion of the trace. Thus, the repeating grid pattern of ground plane 202 is varied in that region to help maintain the impedance of the trace within a desired range. In the depicted example, the orientations of intersecting lines or line segments in the region of the curved portion 204b are shifted relative to other portions of the ground plane pattern, such that the angle between the curved portion 204b of the circuit trace and the intersecting lines of the ground trade remains at substantially 90 degrees. Additionally, the orientations of adjacent lines or line segments in the region of the curved portion 204b are altered to follow a curve of the circuit trace, such that the lines remain disposed at substantially similar distances from the circuit trace. This may help to match the impedance of the curved portion of the trace more closely to that of the straight portion of the trace than if the ground plane pattern were not varied.

In the example of FIG. 2, the orientation of lines of a rectangular grid vary based on a direction of a circuit trace, but it will be understood that other patterns may be used and/or other variations may be made to the pattern based upon a directional change of a trace. For example, a pattern may be based on other polygonal shapes (e.g. hexagons), patterns of ellipses, holes, etc. As non-limiting examples of other variations that may be used, a spacing between lines of a grid or other pattern elements may be varied, an orientation of pattern features may be changed, a density or quantity of electrically conductive material may be varied, a thickness/width/height/other dimension of a portion of the ground plane pattern may be varied, a size and/or number of holes in the ground plane in a region of the circuit trace may be varied based on a location of the holes relative to the circuit trace, and/or any other suitable feature of the ground plane may be varied based on a change in direction of the circuit trace.

In the example of FIGS. 2-3, the depicted PCB 200 comprises a single ground plane 202, wherein the view of FIG. 3 is taken along line A-A of FIG. 2. In this view, 202a represents lines of conductive material traversing through the page and 202b represents lines of conductive material traversing across the page. A dielectric substrate layer 302 is disposed between the conductive material of ground plane layer 202 and circuit trace 204. It will be understood that the sectional view of FIG. 3 is intended to be illustrative and not limiting, as a single ground plane PCB may have any other suitable arrangement of layers.

Figure 4:
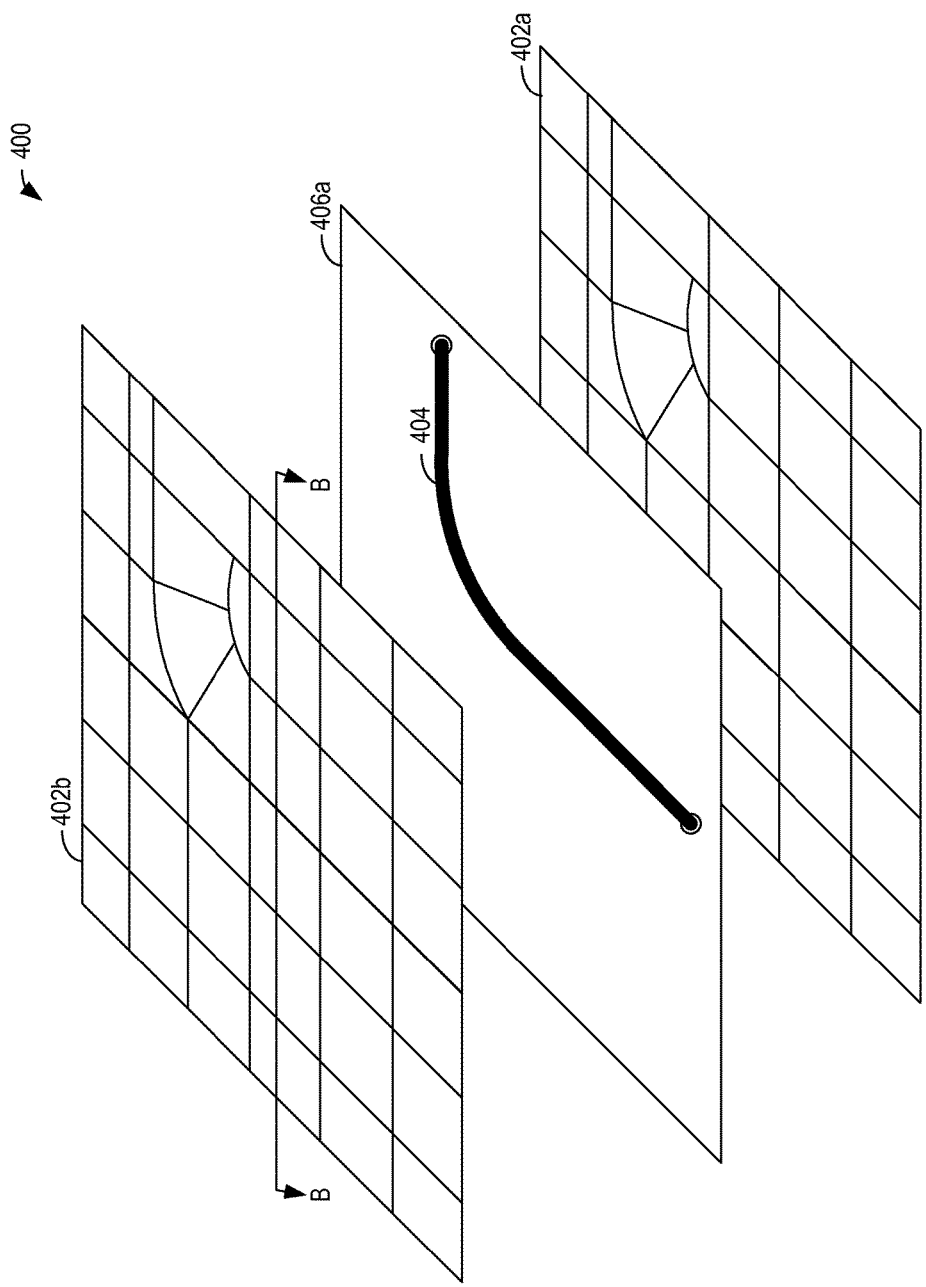
FIG. 4 shows an exploded view of an example printed circuit board having two ground plane layers.
Figure 5:
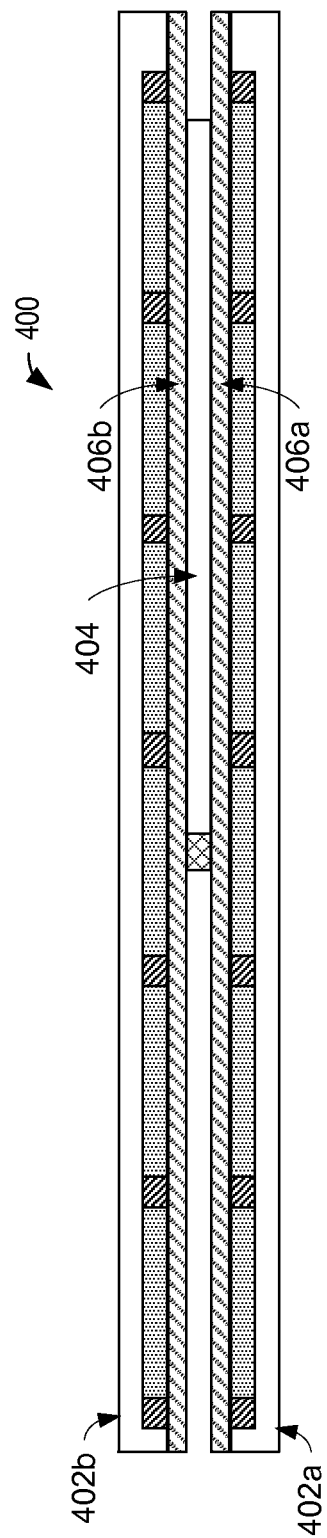
FIG. 5 shows a cross section of the printed circuit board of FIG. 4.

In other examples, a PCB may comprise multiple ground plane layers. FIG. 4 shows an exploded view of a PCB 400 comprising a pair of ground plane layers 402a and 402b, and FIG. 5 shows a sectional view of the PCB 400. Referring first to FIG. 4, the PCB comprises a circuit trace 404 disposed on a substrate 406a and sandwiched between the two ground plane layers 402a and 404b. It is to be understood that additional layers also may be included, such as a dielectric layer between circuit trace 404 and ground plane layer 402b, as illustrated in FIG. 5. As shown, each ground plane layer 402a and 402b may include the pattern distortion described above with respect to FIG. 2 to provide impedance matching along the length of circuit In FIG. 5, ground plane layer 402a is positioned below circuit trace 404 (separated by dielectric layer 406a) and ground plane layer 402b is positioned above circuit trace 404 (separated by dielectric layer 406b) with respect to the orientation shown in FIG. 5. Each ground plane layer 402a and 402b may include conductive material disposed in perpendicular lines, as depicted in ground plane layers 404a and 404b of FIG. 4.

Figure 6:
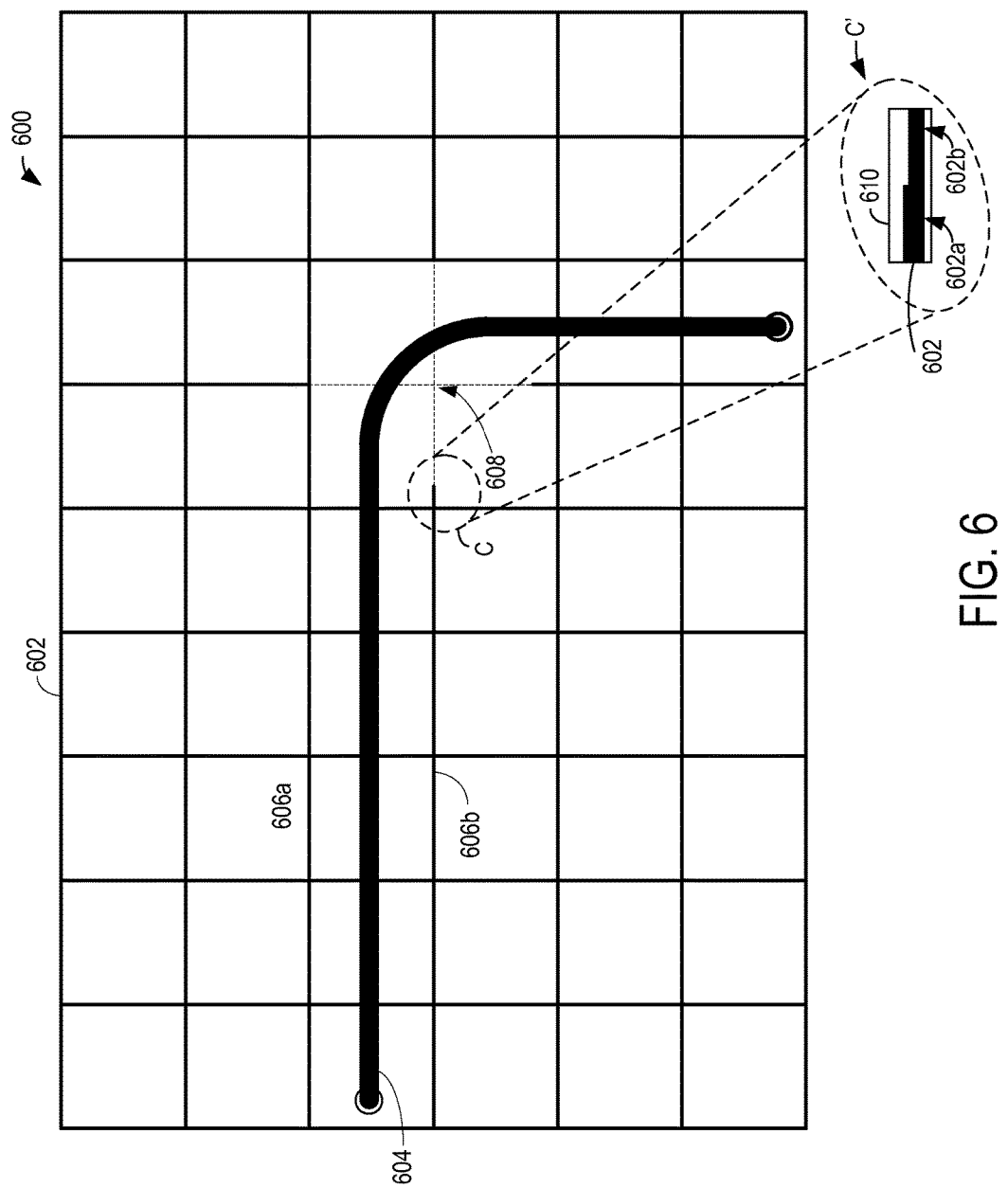
FIG. 6 shows an example printed circuit board including a ground plane with a pattern of conductive material having a varying thickness based upon a directional change of a circuit trace.

As mentioned above, other characteristics of a pattern of conductive material may be varied in order to maintain a suitably consistent impedance along a circuit trace having directional changes. For example, FIG. 6 shows a PCB 600 in which a thickness of conductive material of a ground plane 602 is varied based on a direction of a circuit trace 604. As an impedance of a trace is a function of a quantity of ground plane material adjacent to the trace, varying a thickness of the ground plane pattern in regions of a directional change of the trace may help to maintain a more consistent quantity of the ground plane material adjacent to the trace along a length of the trace. In the region of the curve in circuit trace 604, the closer relative proximity of the cross point 608 of the ground plane pattern to the trace may result in a greater quantity of ground plane in the curved region than in uncurved regions of the circuit trace. Accordingly, as represented by the dashed lines in that region of the grid of ground plane 602, the thickness or width of conductive material may be reduced in order to match a density or quantity of conductive material in the curved portion of the adjustable region 606 with the density or quantity of conductive material in the uncurved portion of the adjustable region. The varying thickness of the conductive material is further illustrated in zoomed-in region C', which shows an example cross section of PCB 600 at region C in which conductive material of the ground plane layer 602 (e.g., positioned below substrate 610) 602a is thicker than conductive material 602b.

Figure 7:
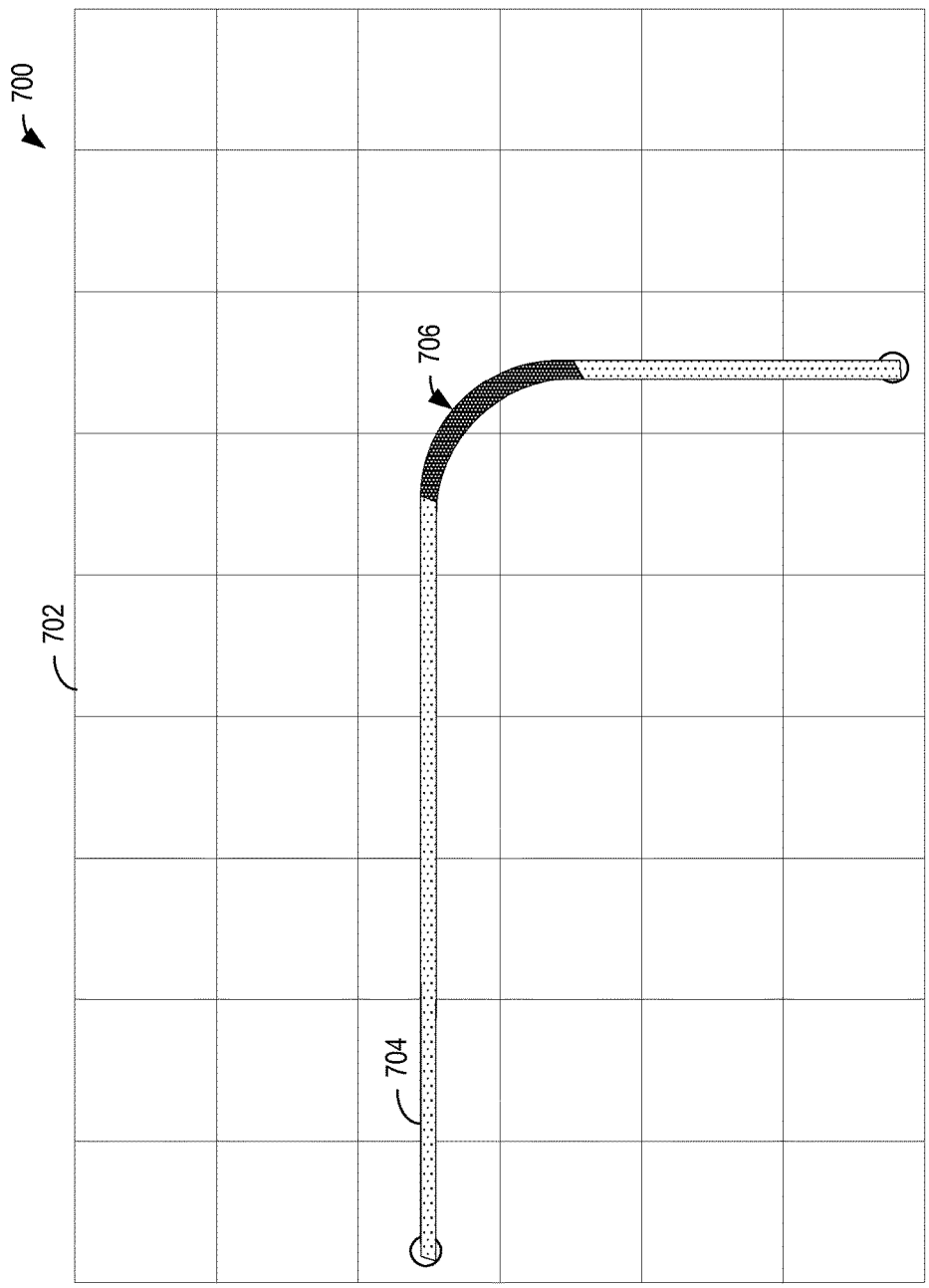
FIG. 7 shows an example printed circuit board including a circuit trace composed of different materials that vary based upon a directional change of the circuit trace.

As another example, a material of a circuit trace and/or a ground plane pattern may be varied in order to match impedance of the circuit trace and ground along the length of the circuit trace. FIG. 7 shows an example PCB 700 having a ground plane 702 and a circuit trace 704. In a curved region 706 of circuit trace 704, a different conductive material from the material included in uncurved regions of the circuit trace is used to form the curved portion of the circuit trace, as indicated by the different fill pattern. The different material may compensate for the change in impedance in that area resulting from the different geometric relationship between the circuit trace and the pattern of the ground plane. It will be understood that the conductive material used to form the ground plane may be varied instead of or in addition to the circuit trace material.

Figure 8:
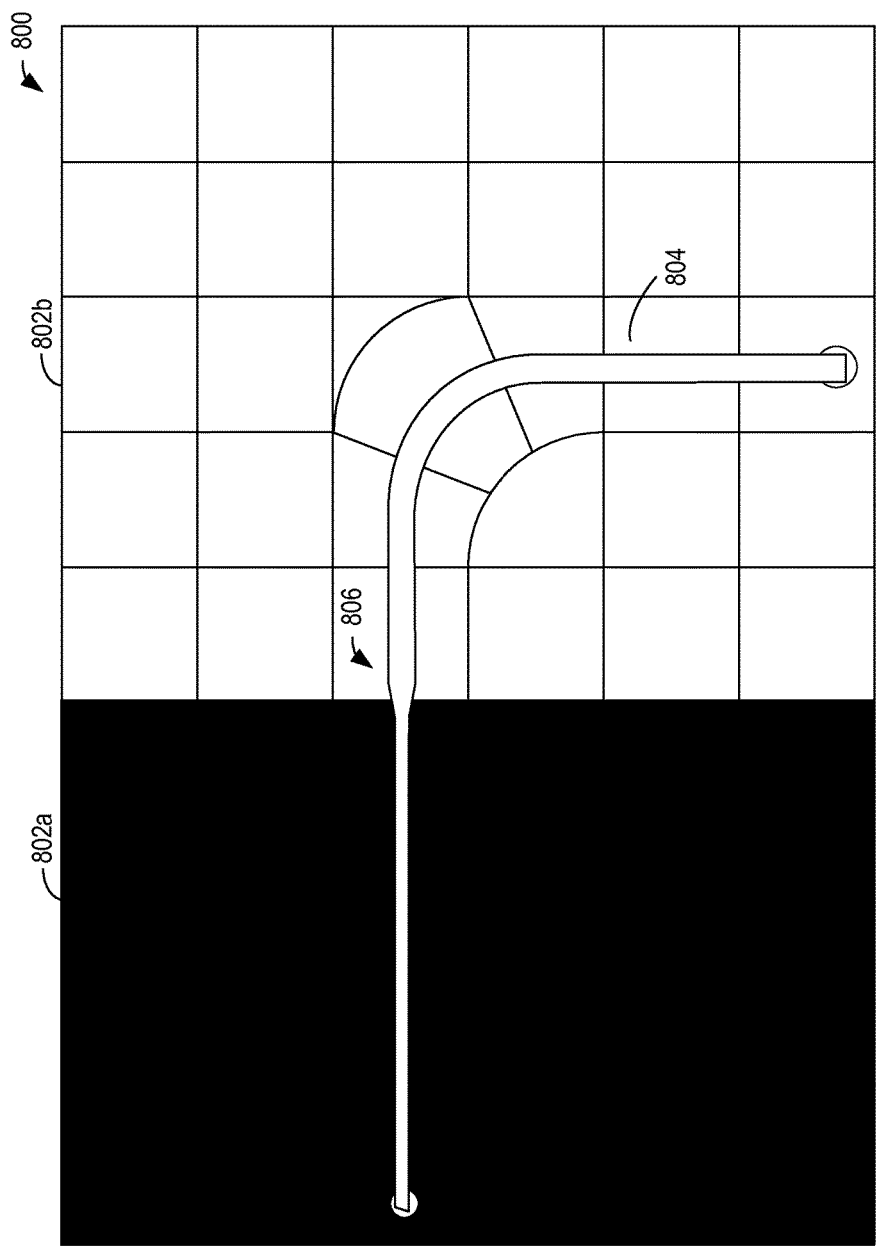
FIG. 8 shows an example printed circuit board including a ground plane segmented into solid and patterned regions and a circuit trace having a width that varies based upon a directional change of the circuit trace.

In yet other examples, a width of a circuit trace may be varied in order to match impedance of the circuit trace and ground along the length of the circuit trace. FIG. 8 shows an example PCB 800 having a solid ground plane region 802a (e.g., substantially 100% filled with conductive material) and a patterned ground plane region 802b (e.g., having conductive material disposed in a grid-like pattern). PCB 800 also includes a circuit trace 804 that traverses both the solid ground plane region 802a and the patterned ground plane region 802b. As shown, the width of circuit trace 804 varies as the circuit trace traverses the different regions. In a similar manner, a thickness of the trace alternatively or additionally maybe varied. In the depicted example, the circuit trace is wider/thicker at 806 (e.g., where the circuit trace traverses the patterned ground plane region 802b) than where the circuit trace traverses the solid ground plane region 802a, but may be varied in any other suitable manner For example, the width/thickness of the circuit trace also may be varied in regions where the directionality of the circuit trace changes (e.g., in curved regions of the circuit trace) relative to uncurved regions of the circuit trace. The width/thickness of the circuit trace may also be varied as the circuit trace traverses regions of the ground plane having different patterns and/or types of conductive material.

The disclosed examples herein may help to avoid undesirable changes in impedance along a signal trace that changes direction relative to a ground plane pattern. It will be noted that the pattern and/or trace characteristics described above are presented for the purpose of example and are not intended to be limiting, as any other suitable characteristic or characteristics of a circuit trace and/or ground plane pattern may vary in places where the circuit trace changes direction in a plane of the ground plane.

In some embodiments, the systems, methods, and processes described herein may be tied to a computing system of one or more computing devices. In particular, such methods and processes may be implemented as a computer-application program or service, an application-programming interface (API), a library, and/or other computer-program product.

Figure 9:
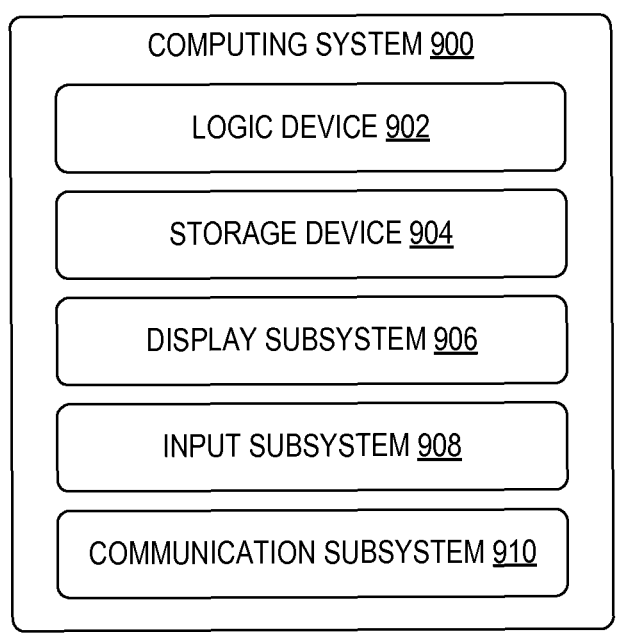
FIG. 9 is a block diagram of an example computing system.

FIG. 9 schematically shows a non-limiting embodiment of a computing system 900 that can enact one or more of the methods and processes described above. Computing system 900 is shown in simplified form. Computing system 900 may take the form of one or more mobile computing devices, mobile communication devices (e.g., smart phone), personal computers, server computers, tablet computers, home-entertainment computers, network computing devices, gaming devices, and/or other computing devices, and may comprise one or more printed circuit boards as described herein.

Computing system 900 includes a logic device 902 and a storage device 904. Computing system 900 may optionally include a display subsystem 906, input subsystem 908, communication subsystem 910, and/or other components not shown in FIG. 9. One or more of the above-described components may be included in computing device 100 of FIG. 1.

Logic device 902 includes one or more physical devices configured to execute instructions. For example, the logic device may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result. Processor 106 of FIG. 1 may be an example of logic device 902.

The logic device may include one or more processors configured to execute software instructions. Additionally or alternatively, the logic device may include one or more hardware or firmware logic devices configured to execute hardware or firmware instructions. Processors of the logic device may be single-core or multi-core, and the instructions executed thereon may be configured for sequential, parallel, and/or distributed processing. Individual components of the logic device optionally may be distributed among two or more separate devices, which may be remotely located and/or configured for coordinated processing. Aspects of the logic device may be virtualized and executed by remotely accessible, networked computing devices configured in a cloud-computing configuration.

Storage device 904 includes one or more physical devices configured to hold machine-readable instructions executable by the logic device to implement the methods and processes described herein. When such methods and processes are implemented, the state of storage device 904 may be transformed—e.g., to hold different data. Storage device 108 of FIG. 1 may be an example of storage device 904.

Storage device 904 may include removable and/or built-in devices. Storage device 904 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage device 904 may include volatile, non-volatile, dynamic, static, read/write, read-only, random-access, sequential-access, location-addressable, file-addressable, and/or content-addressable devices.

It will be appreciated that storage device 904 includes one or more physical devices. However, aspects of the instructions described herein alternatively may be propagated by a communication medium (e.g., an electromagnetic signal, an optical signal, etc.) that is not held by a physical device for a finite duration.

Aspects of logic device 902 and storage device 904 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 906 may be used to present a visual representation of data held by storage device 904. This visual representation may take the form of a graphical user interface (GUI). As the herein described methods and processes change the data held by the storage device, and thus transform the state of the storage device, the state of display subsystem 906 may likewise be transformed to visually represent changes in the underlying data. Display subsystem 906 may include one or more display devices utilizing virtually any type of technology. Such display devices may be combined with logic device 902 and/or storage device 904 in a shared enclosure, or such display devices may be peripheral display devices.

When included, input subsystem 908 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 910 may be configured to communicatively couple computing system 900 with one or more other computing devices. Communication subsystem 910 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 900 to send and/or receive messages to and/or from other devices via a network such as the Internet.

Another example provides a printed circuit board comprising a ground plane comprising a pattern of an electrically conductive material, and a circuit trace disposed adjacent to the ground plane, where one or more characteristics of one or more of the pattern of the electrically conductive material in the ground plane and the circuit trace vary based upon a directional change of the circuit trace. In such an example, the pattern may additionally or alternatively be a grid, and a spacing between lines of the grid and the circuit trace may vary based upon the directional change of the circuit trace. In such an example, the one or more characteristics may additionally or alternatively include a quantity of the electrically conductive material within a selected distance of the circuit trace. In such an example, the quantity of the electrically conductive material may additionally or alternatively vary per unit area of the printed circuit board along the circuit trace based upon the directional change of the circuit trace. In such an example, the predefined range may additionally or alternatively be based on a total fill of conductive material in the ground plane, and the range may additionally or alternatively decrease with decreasing fill percentages. In such an example, the thickness of the pattern of electrically conductive material may additionally or alternatively vary per unit area of the printed circuit board along the circuit trace based upon the direction change of the circuit trace. In such an example, the pattern may additionally or alternatively comprise different electrically conductive materials, and the one or more characteristics of the pattern of the electrically conductive material in the ground plane that vary may additionally or alternatively include amounts of the different electrically conductive materials within a selected distance of the trace. In such an example, the one or more characteristics of the pattern that vary may additionally or alternatively include a geometry of the pattern. In such an example, the pattern may additionally or alternatively include a plurality of holes formed in the electrically conductive material, and one or more of a size and a shape of holes may additionally or alternatively vary based on the directional change of the circuit trace. In such an example, the pattern may additionally or alternatively include a plurality of shapes, and one or more of a size of one or more shapes and an orientation of one or more shapes of the pattern may additionally or alternatively vary based on the directional change of the circuit trace. Any or all of the above-described examples may be combined in any suitable manner in various implementations.

Another example provides a printed circuit board comprising a ground plane comprising a pattern of an electrically conductive material, and at least one circuit trace disposed adjacent to the ground plane, the circuit trace including a portion that is uncurved in the plane of the ground plane and a portion that is curved in the plane of the ground plane, and the pattern including a repeating pattern element, and wherein an orientation of an instance of the repeating pattern element varies within the pattern depending upon one or more of a direction of the circuit trace and a curvature of the circuit trace. In such an example, the pattern may additionally or alternatively be a grid comprising a plurality of lines, and an orientation of at least one line of the plurality of lines of the grid may additionally or alternatively vary based upon one or more of the direction of the circuit trace and the curvature of the circuit trace. In such an example, the orientation of the instance of the repeating pattern element may additionally or alternatively vary to maintain a quantity of the conductive material per unit area of the printed circuit board along the circuit trace based upon the directional change of the circuit trace. In such an example, the predefined range may additionally or alternatively be based on a total fill of conductive material in the ground plane, and the range may additionally or alternatively decrease with decreasing fill percentages. In such an example, the orientation of the instance of the repeating pattern element may additionally or alternatively vary to match a relative geometry between the instance and one or more of the direction of the circuit trace and the curvature of the circuit trace. Any or all of the above-described examples may be combined in any suitable manner in various implementations.

Another example provides a mobile device comprising a printed circuit board comprising a substrate, a ground plane coupled to the substrate and comprising a pattern of one or more electrically conductive materials, and a plurality of electrical components, at least one of the plurality of electrical components being communicatively coupled to another of the plurality of electrical components via a circuit trace disposed adjacent to the ground plane, where one or more characteristics of the pattern of the electrically conductive material in the ground plane varies within the ground plane based upon a directional change of the circuit trace. In such an example, the plurality of electrical components may additionally or alternatively include a digital camera interface and a processor, and the circuit trace may additionally or alternatively communicatively couple the digital camera interface to the processor. In such an example, the pattern may additionally or alternatively be a grid, and a spacing between lines of the grid and the circuit trace may additionally or alternatively vary based upon the directional change of the circuit trace. In such an example, the ground plane may additionally or alternatively comprise a multi-layer ground plane, and a first layer of the ground plane and a second layer of the ground plane may additionally or alternatively be disposed on opposing sides of the circuit trace. In such an example, the quantity of the electrically conductive material may additionally or alternatively vary per unit area of the printed circuit board along the circuit trace based upon the directional change of the circuit trace. Any or all of the above-described examples may be combined in any suitable manner in various implementations.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A printed circuit board comprising:
  a ground plane comprising a grid pattern of lines of an electrically conductive material, the grid pattern of lines formed from a plurality of lines in a first direction and a plurality of lines in a second direction, the plurality of lines in the second direction intersecting the plurality of lines in the first direction; and
  a circuit trace separated from the ground plane by a dielectric layer, where at least one line in the ground plane comprises a curve concentric with a curve of the circuit trace, and wherein at least one line in the ground plane intersects the at least one line in the ground plane comprising the curve.

2. The printed circuit board of claim 1, wherein the one or more characteristics include a quantity of the electrically conductive material within a selected distance of the circuit trace.

3. The printed circuit board of claim 2, wherein the quantity of the electrically conductive material varies per unit area of the printed circuit board along the circuit trace based upon the directional change of the circuit trace.

4. The printed circuit board of claim 3, wherein the predefined range is based on a total fill of conductive material in the ground plane, and wherein the range decreases with decreasing fill percentages.

5. The printed circuit board of claim 1, wherein one or more of the thickness of the pattern of electrically conductive material and the thickness of the circuit trace varies per unit area of the printed circuit board along the circuit trace based upon one or more of the direction change of the circuit trace and a change in the pattern of electrically conductive material in the ground plane.

6. The printed circuit board of claim 1, wherein the pattern comprises different electrically conductive materials, and wherein the one or more characteristics of the pattern of the electrically conductive material in the ground plane that vary includes amounts of the different electrically conductive materials within a selected distance of the trace.

7. The printed circuit board of claim 1, wherein the ground plane further includes a plurality of holes formed in the electrically conductive material, and wherein one or more of a size and a shape of holes varies based on a directional change of the circuit trace.

8. The printed circuit board of claim 1, wherein the ground plane further includes a plurality of shapes, and wherein one or more of a size of one or more shapes and an orientation of one or more shapes of the ground plane varies based on a directional change of the circuit trace.

9. A printed circuit board comprising:
  a ground plane comprising a grid pattern of lines of an electrically conductive material, the grid pattern of lines formed from a plurality of lines in a first direction and a plurality of lines in a second direction, the plurality of lines in the second direction intersecting the plurality of lines in the first direction; and
  at least one circuit trace separated from the ground plane by a dielectric layer, the circuit trace including an uncurved portion and a curved portion, and
  the ground plane including at least one line comprising a curve following the curved portion of the circuit trace such that the at least one line of the ground plane comprising the curve remains disposed at a substantially similar distance from the circuit trace throughout the curved portion and the uncurved portion of the circuit trace.

10. The printed circuit board of claim 9, wherein an orientation of at least one line of the ground plane varies based upon one or more of a direction of the circuit trace and a curvature of the circuit trace.

11. The printed circuit board of claim 9, wherein an orientation of the grid pattern of lines varies to maintain a quantity of the conductive material per unit area of the printed circuit board along the circuit trace based upon a directional change of the circuit trace.

12. The printed circuit board of claim 11, wherein a predefined range is based on a total fill of the conductive material in the ground plane, and wherein the predefined range decreases with decreasing fill percentages.

13. The printed circuit board of claim 9, wherein an orientation of the grid pattern of lines varies to match a relative geometry between the grid pattern of lines and one or more of a direction of the circuit trace and a curvature of the circuit trace.

* * * * *